March 16, 1965 L. L. GROVER 3,174,111

TWIN-T FILTER WITH NEGATIVE FEEDBACK

Filed July 5, 1961

INVENTOR

Lawrence L. Grover

BY

Stevens, Davis, Miller & Mosher

ATTORNEYS

United States Patent Office 3,174,111
Patented Mar. 16, 1965

3,174,111

TWIN-T FILTER WITH NEGATIVE FEEDBACK

Lawrence L. Grover, Melbourne, Fla., assignor to Texas Instruments Incorporated, Dallas, Tex., a corporation of Delaware Filed July 5, 1961, Ser. No. 121,937
3 Claims. (Cl. 330—28)

This invention relates to a filter circuit and more particularly to a negative feedback arrangement for a twin-T filter.

When it is necessary to incorporate a filter network in an electrical circuit for selecting or rejecting a certain range of frequencies, it is often preferable to employ only resistive and capacitive components. This is because inductive elements are not only relatively expensive, but are also heavy and large in size, particularly in the audio frequency range. One of the most effective R-C filter networks used for these purposes is a type commonly referred to as the twin-T filter. A twin-T filter can be designed to have fairly high attenuation at a particular null frequency, but it is found that the gradient of attenuation near the null frequency is relatively low and further that the attenuation at frequencies above the null frequency is not great enough to provide an entirely successful low-pass filter. Furthermore, the characteristics of a twin-T filter are adversely affected by connecting a low impedance load thereto. This feature is particularly troublesome when an attempt is made to use a twin-T filter in the input to a transistor amplifier, which would ordinarily exhibit a very low input impedance.

Accordingly, it is a principal object of this invention to provide a resistance-capacitance filter circuit having very high attenuation at a particular null frequency.

Another object is to provide a resistance-capacitance filter network having a high gradient of attenuation near the cut-off frequency.

It is a further object to provide a resistance-capacitance filter network having high attenuation characteristics above the null frequency.

In addition, it is an object of this invention to provide an R-C filter network adapted for operation with transistor amplifiers having low input impedances.

Still another object is to provide an improved twin-T-type filter network which is adapted for use as a low-pass or high-pass filter arrangement.

In accordance with the present invention, a resistance-capacitance filter network similar to the twin-T type is provided with a feedback arrangement to enhance the frequency-response characteristics thereof. For example, negative feedback can be applied to an intermediate point in a twin-T network and thereby increase the attenuation at the null frequency and increase the gradient of attenuation near the null frequency. Further, very high attenuation can be obtained at frequencies above the null point, making the arrangement particularly adapted for use as a low-pass filter.

Figure 1:
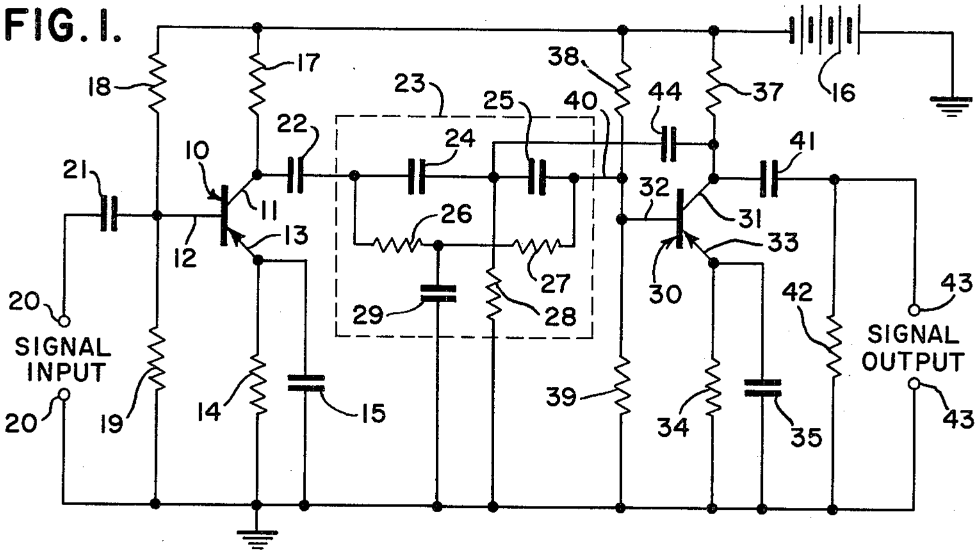
Figure 2:
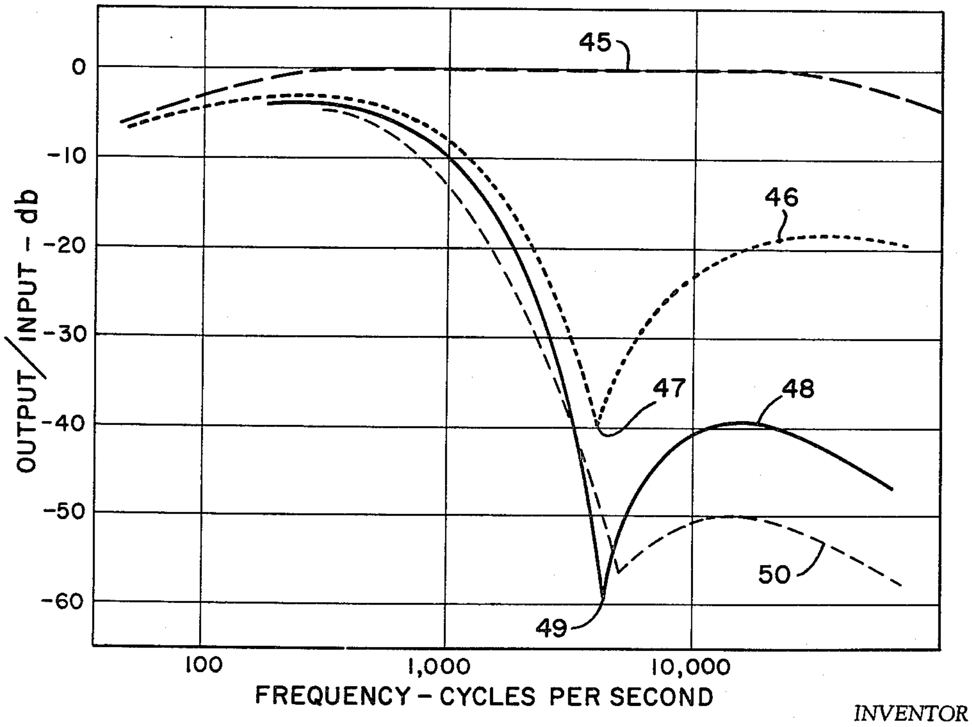

Additional objects of this invention will be apparent from the appended claims. The invention itself, as well as further features, objects and advantages thereof, will best be understood from the following description of a particular embodiment of the invention, when read in conjunction with the accompanying drawing, in which:

FIGURE 1 is a schematic diagram of an electrical circuit incorporating the principal features of the invention; and FIGURE 2 is a graphic representation of the frequency-response characteristics of the circuit of FIGURE 1 under various conditions.

With reference to the schematic diagram of FIGURE 1, there is illustrated a two-stage amplifier circuit constructed according to this invention. A first amplifier stage of conventional design is shown utilizing a transistor 10 having a collector 11, a base 12 and an emitter 13. The emitter 13 is connected to ground through a resistor 14 and a by-pass condenser 15. The collector 11 is connected to a negative voltage supply 16 through a load resistor 17. Operating bias is applied to the base 12 by a voltage divider including a pair of resistors 18 and 19 connected across the negative supply 16. The base 12 is also connected to a signal input terminal 20 through a coupling condenser 21. The output of the first amplifier stage is applied through a coupling condenser 22 to a twin-T filter 23.

The twin-T filter 23 comprises a pair of serially connected capacitors 24 and 25 which is connected in parallel with a pair of series resistors 26 and 27. The junction of the capacitors 24 and 25 is connected to ground through a resistor 28 while the junction of the resistors 26 and 27 is connected to ground through a capacitor 29. The output of the twin-T filter 23 is applied to the input of a second amplifier stage.

The second amplifier stage is of a conventional design similar to the first amplifier stage, and utilizes a transistor 30 having a collector 31, a base 32 and an emitter 33. The emitter 33 is connected to ground through a resistor 34 and a by-pass condenser 35. The collector 31 is connected to the negative supply 16 through a load resistor 37. Suitable operating bias is applied to the base 32 by a pair of resistors 38 and 39 arranged as a voltage divider across the source 16. The output of the twin-T filter 23 appearing on a line 40 is also applied to the base 32. The output of the second amplifier stage appears on the collector 31 and is applied through a coupling condenser 41 across an output resistor 42 and across a pair of output terminals 43. To provide the advantageous characteristics of this invention, the output from the second amplifier stage is also connected from the collector 31 through a coupling condenser 44 to the junction of the capacitors 24 and 25 in the twin-T filter 23. The latter coupling provides the necessary negative feedback to the twin-T filter.

While the particular values of the circuit components, as well as the circuit configuration itself, may be subject to design variations dependent upon the system in which the circuit is to be utilized, the following table presents typical values of the various components which may be used in the circuit of FIGURE 1.

| | |
|---|---|
| Transistors 10 and 30 | Texas Instruments 2N291. |
| Resistors 14, 34, and 42 | 2K ohm. |
| Resistors 17 and 37 | 6.8K ohm. |
| Resistors 18 and 38 | 91K ohm. |
| Resistors 19 and 39 | 20K ohm. |
| Resistors 26, 27 and 28 | 1.1K ohm. |
| Capacitors 15 and 35 | 50 $\mu$fd. |
| Capacitors 21, 22 and 41 | 20 $\mu$fd. |
| Capacitors 24, 25 and 29 | 0.05 $\mu$fd. |
| Capacitor 44 | 0.022 $\mu$fd. |

Utilizing the circuit shown in FIGURE 1 and described above, a frequency-response characteristic such as shown in graphic form in FIGURE 2 may be obtained. The graph of FIGURE 2 includes a dashed line 45 which represents the response characteristic of a two-stage amplifier similar to that of FIGURE 1 wherein no filter is imposed between the first and second stages. That is, a response as represented by the line 45 is obtained if the output of the first stage is coupled from the collector 11 by the coupling capacitor 22 to the base 32 in the second stage. It is seen that such a two-stage amplifier is virtually linear over the audio range. FIGURE 2 further includes a dotted line 46 which represents the frequency response characteristics of a two-stage amplifier circuit similar to that of FIGURE 1 utilizing a twin-T filter between the stages but including no feedback from the second stage to the filter; i.e., a response characteristic as represented by the line 46 is obtained if the feedback coupling capacitor 44 is omitted. It is seen that a reasonably sharp null point 47 is obtained at the center frequency of the R-C filter 23, but at frequencies above the null point 47 the attenuation is significantly reduced, reaching an attenuation of less than 20 db, which would be unsuitable in many situations.

Thus, in accordance with the principal feature of this invention, a frequency-response characteristic as represented by a solid line 48 in FIGURE 2 is obtained with the circuit of FIGURE 1 by utilizing the feedback coupling capacitor 44. It is seen that the frequency response drops with a very steep slope to an extremely sharp null point 49 and at higher frequencies the attenuation is at all points greater than about 40 db. Even greater attenuation at frequencies above the null point may be obtained by increasing the magnitude of the capacitor 44. The response of a circuit wherein the magnitude of the capacitor 44 is 0.068 $\mu$fd., instead of 0.022 $\mu$fd., is illustrated in FIGURE 2 by a dashed line 50. It is seen, however, that the increased attenuation at higher frequencies is obtained at the expense of a reduction in the slope of the response characteristic below the null point when compared to the line 48.

The operation of the circuit of FIGURE 1 may best be understood by first considering the operation of the circuit as a two-stage amplifier utilizing a twin-T filter as a coupling element but not including the feedback from the second stage to the twin-T filter. In this situation, at frequencies below the null point, the capacitors 24 and 25 will appear as high impedances and the input signal will appear across a voltage divider comprising the resistors 26, 27 and 39, thus being virtually undiminished since the resistors 26 and 27 are of relatively low value. At frequencies above the null point, the capacitors 24 and 25 will present low impedances and contribute little to attenuation, the capacitor 29 shorting the resistors 26 and 27 to ground being the major factor in the attenuation presented by the filter. At the null point, the attenuation will be very high since signals reaching the lead 40 through the path including the capacitors 24 and 25 and the resistor 28 will be shifted in phase in one direction while the signals reaching the line 40 through the path including the resistors 26 and 27 and the capacitor 29 will be shifted in phase the opposite direction. Thus, the signals will be approximately 180° out of phase and will cancel. At higher frequencies, however, the attenuation will necessarily be reduced, since the impedance presented by the capacitors 24 and 25 continually decreases while the impedance presented in the other path by the resistors 26 and 27 remains more nearly constant.

The operation of the circuit of FIGURE 1 should now be examined assuming that feedback is provided from the second amplifier stage by the capacitor 44. In this case, at low frequencies the capacitors 24 and 25 still present a high impedance and the primary signal path is through the resistors 26 and 27. The negative feedback, or the feedback through the capacitor 44 which is 180° out of phase with the signal input, has little effect since the impedance of the capacitors 24 and 25 is very large compared to the magnitude of the resistor 28. At the null point, additional attenuation is obtained, since the feedback signal which is in phase opposition with the input signal contributes an added component to bring the signals reaching the line 40 more nearly to a 180° phase relationship. At frequencies above the null point, attenuation from the circuit is greater since an out-of-phase signal will be added to the input signal which is propagated with little attenuation through the capacitors 24 and 25, thus reducing the apparent amplitude of the signal reaching the line 40.

Thus, it is seen that an amplifier circuit is obtained having a sharp cut-off at some particular frequency as determined by the center frequency of a twin-T filter and also having very high attenuation at frequencies higher than the cut-off frequency. This arrangement may be utilized in an amplifier circuit such as that shown in FIGURE 1 to provide low attenuation up to a certain frequency and high attenuation thereafter. Alternatively, this filter network could be utilized in a feedback arrangement whereby negative feedback is provided between the output and input of several amplifier stages at all frequencies except the null frequency of the twin-T filter arrangement. The sharp bandpass characteristics of such an arrangement would be enhanced by the negative feedback to the twin-T filter.

While this invention has been described in terms of an illustrative embodiment, this description is not intended to be construed in a limiting sense. It is, of course, understood that various modifications may be made by persons skilled in the art, and it is therefore contemplated that the appended claims will cover any such modifications as fall within the true scope of the invention.

What is claimed is:

1. A filter circuit comprising a pair of series capacitors, a resistor connecting the junction of said pair of capacitors to a reference potential, a pair of series resistors connected across said pairs of capacitors, a capacitor connecting the junction of said pair of resistors to a reference potential, means for connecting a signal source between one end of said pair of capacitors and said reference potential, a signal load connected between the other end of said pair of capacitors and said reference potential, means including said signal load for generating a feedback signal in phase opposition to the signal appearing at said signal load, the feedback signal having a magnitude which is a continuous function of the signal appearing at said signal load, and means capacitively coupling said feedback signal to said junction of said pair of capacitors.

2. A filter circuit comprising an input terminal, an output terminal, a pair of capacitors connected together at a first junction point and connected in series between said input and output terminals, a pair of resistors connected together at a second junction point and connected in series between said input and output terminals, a resistor connecting said first junction point to a reference potential, a capacitor connecting said second junction point to said reference potential, and means for generating a feedback signal having an amplitude which is a continuous function of the signal appearing at said output terminal, said means having an input connected to said output terminal and having an output connected to said first junction point.

3. A filter circuit comprising an input terminal, an output terminal, a pair of capacitors connected together at a first junction point and connected in series between said input and output terminals, a pair of resistors connected together at a second junction point and connected in series between said input and output terminals, a resistor connecting said first junction point to a reference potential, a capacitor connecting said second junction point to said reference potential, an amplifier including a transistor having input, output and common electrodes, said input electrode being coupled to said output terminal, said common electrode being coupled to said reference potential, an output circuit including said output and common electrodes and a load impedence, and a capacitor connected between said load impedence and said first junction point to apply negative feedback signals thereto.

References Cited in the file of this patent

UNITED STATES PATENTS

| | | |
|---|---|---|
| 2,459,046 | Rieke | Jan. 11, 1949 |
| 2,466,904 | Lundstrom | Apr. 12, 1949 |
| 2,568,868 | Pratt | Sept. 25, 1951 |
| 2,987,678 | Miller et al. | June 6, 1961 |
| 3,016,515 | Summers et al. | Jan. 9, 1962 |